United States Patent [19]

Hale et al.

[11] 4,123,695
[45] Oct. 31, 1978

[54] PATTERN RECOGNITION SYSTEM

[75] Inventors: Jacques A. G. Hale, Crawley Down; Alan Robert Turner-Smith, Redhill, both of England

[73] Assignee: U.S. Philips Corporation, New York, N.Y.

[21] Appl. No.: 618,031

[22] Filed: Sep. 30, 1975

[30] Foreign Application Priority Data

Oct. 4, 1974 [GB] United Kingdom ............... 43136/74

[51] Int. Cl.² ........................................... G05B 13/00
[52] U.S. Cl. .................................... 318/561; 318/572; 318/640
[58] Field of Search ..................... 318/640, 572, 561; 356/142, 152, 172; 178/DIG. 21, 6.8

[56] References Cited

U.S. PATENT DOCUMENTS

| | | | |
|---|---|---|---|
| 3,700,801 | 10/1972 | Dougherty | 178/DIG. 21 |
| 3,739,247 | 6/1973 | Yamaguchi et al. | 318/640 |
| 3,769,456 | 10/1973 | Woolfson | 178/DIG. 21 |
| 3,794,761 | 2/1974 | Genchi et al. | 178/DIG. 21 |
| 3,829,614 | 8/1974 | Ahlbom et al. | 178/DIG. 21 |
| 3,838,274 | 9/1974 | Doubek, Jr. et al. | 356/152 |
| 3,878,323 | 4/1975 | Fisher | 178/DIG. 21 |
| 3,903,357 | 9/1975 | Woolfson et al. | 178/DIG. 21 |
| 3,930,150 | 12/1975 | Marantette | 356/172 |
| 3,947,628 | 3/1976 | Alien et al. | 178/DIG. 21 |

OTHER PUBLICATIONS

Electronics, "High Speed Servo Positioner," Feb. 8, 1963, pp. 58–61.

Primary Examiner—Robert K. Schaefer
Assistant Examiner—Eugene S. Indyk
Attorney, Agent, or Firm—Frank R. Trifari; Daniel R. McGlynn

[57] ABSTRACT

An automatic machine including a two-dimensional positioning table, a device for measuring the dispositions attained by the table in each of said dimensions and a tool holder having an operative center in respect to said two dimensions. Furthermore means are provided for imaging a graticule means to an operative plane of the table so that the center of said image is substantially aligned with the operative center of the tool holder. A visual input device is positioned to view a part of said operative plane including said graticule image and comprises pattern recognition apparatus for:
  (a) identifying a predetermined mark on a flat surface of an object carried by said table, said flat surface lying in said operative plane,
  (b) identifying said graticule image, and
  (c) measuring the separation of said mark from said graticule image center.

11 Claims, 16 Drawing Figures

|    |    |    |    |    |    |    |    |    |    |    |
|----|----|----|----|----|----|----|----|----|----|----|
|    |    |    |    | 24 | 26 | 25 | 23 | 27 | 29 | 25 |
|    |    |    |    |    | 19 | 23 | 25 | 26 | 23 | 24 | 29 |
|    |    |    | 4  | 6  | 12 | 21 | 19 | 23 | 26 | 24 |
|    |    |    | 1  | 3  | 2  | 10 | 20 | 23 | 27 | 28 |
|    |    | 0  | 1  | 3  | 2  | 4  | 27 | 25 | 24 | 24 |
|    | 2  | 3  | 4  | 1  | 0  | 2  | 19 | 26 | 22 | 27 |
|    | 6  | 19 | 24 | 9  | 1  | 10 | 23 | 24 | 28 | 12 |
| 0  | 5  | 21 | 18 | 8  | 1  | 6  | 19 | 23 | 17 | 4  |
| 1  | 3  | 16 | 15 | 4  | 5  | 18 | 26 | 22 | 6  | 1  |
| 3  | 2  | 1  | 0  | 1  | 5  | 19 | 21 | 24 | 13 | 1  | 2 |
| 19 | 22 | 20 | 18 | 20 | 24 | 26 | 25 | 20 | 4  | 2  | 1 |
| 26 | 20 | 24 | 25 | 24 | 23 | 27 | 24 | 9  | 2  | 0  | 1 |
| 24 | 21 | 25 | 23 | 26 | 21 | 21 | 12 | 1  | 3  | 1  | 0 |
| 20 | 23 | 24 | 22 | 27 | 18 | 7  | 0  | 1  | 1  | 0  | 0 |
| 24 | 26 | 23 | 24 | 20 | 10 | 3  | 0  | 1  | 0  | 0  | 0 | 1 |
| 21 | 21 | 27 | 24 | 8  | 1  | 2  | 1  | 0  | 0  | 1  | 0 | 0 |
| 26 | 25 | 27 | 20 | 4  | 1  | 4  | 11 | 7  | 0  | 1  | 1 | 2 |
| 24 | 29 | 28 | 25 | 18 | 0  | 1  | 10 | 26 | 18 | 1  | 3 | 1 | 1 |
| 25 | 27 | 29 | 21 | 19 | 2  | 1  | 5  | 14 | 8  | 1  | 2 | 1 | 0 |
| 29 | 27 | 29 | 30 | 24 | 22 | 4  | 1  | 0  | 0  | 2  | 0 | 1 | 3 | 1 |

Fig.5

PATTERN RECOGNITION SYSTEM

This invention relates to control equipment for production machinery having a visual input from its environment. In this context the visual input may be provided by a suitably adapted television camera. The visual scene provided will therefore be two-dimensional generally. More particularly therefore the invention relates to machine tools which handle items in two dimensions. A machine for drilling holes in a two dimensional surface of a solid object is a typical example. A printed circuit board is a typical object having a two-dimensional surface. In such board a number of holes must usually be drilled to receive the connection wires of electronic components. The boards are made of a flat sheet of insulating material carrying a layer of copper foil which has been etched away in part to provide conducting pads. A pad provides a solder connection point for a component wire and in a preferred example the pad has a small central area etched away to provide a blob marking the desired site for the hole. Where a hole is required for purposes other than soldering, it may be marked by a dot or other predetermined symbol. It is an object of the invention to provide visual input arrangements capable of identifying a drilling point so marked and then to position it under the drill for the hole to be drilled without human intervention, and without the hole position having to be supplied as is the practice with numerically controlled machines.

In the course of the extended use, such a visually controlled drilling machine may accumulate errors of alignment and scaling between the television camera, the drill and the motions of a carriage to which the board is attached. In accordance with machine tool practice, this carriage will be referred to herein as the positioning table or more simply as the table. These errors may accumulate for a variety of mechanical and electronic reasons. At intervals, it may be desirable to measure and correct these errors and it is a further object of the present invention to do this using the same visual input system as is used to control the drilling operation.

Although the problem and the embodiments of the invention are described as applied to drilling operations, the invention is also applicable to other types of machining, and other kinds of tool. It is applicable to a chain saw, to an automatic welding or bonding apparatus, and the like.

The invention provides an automatic machine tool comprising a two-dimensional positioning table, means for measuring the dispositions attained by the table in each of said dimensions, a tool holder having an operative center in respect to said two dimensions, means for applying an image of a graticule means to an operative plane of the table so that the center of said graticule image is substantially aligned with the operative center of the tool holder, a visual input device positioned to view a part of said operative plane including said graticule image and comprising pattern recognition apparatus adapted to:

(a) identify a predetermined mark on a flat surface of an object carried by said table, said flat surface lying in said operative plane, (b) identify said graticule image, and (c) measure the separation of said mark from said graticule image center, and driving means for driving a relative displacement between the table and the tool holder corresponding to said measured separation to align said mark with said graticule image center.

The graticule may be any two-dimensional pattern chosen to facilitate the finding of its center by the visual input device. A preferred form of graticule may have the general shape of a Maltese cross having a high contrast between the limbs of the cross and its background.

The tool holder may be adapted to accept any machining device with a well defined operative center which can be advanced onto the object orthogonally to said table. A typical tool may be a drill, a punch or any tool working by cutting, grinding, eroding or electrolytic action.

The operative plane of the table is a plane parallel to the plane defined by the said two dimensions, e.g., according to a rectangular or rotation-symmetric system. The operative plane may be at a fixed separation from the bed of the machine tool to facilitate the injection of the graticule image into the operative plane. Mechanical stops or other registration devices may be provided to bring the flat surface of the object into the operative plane.

The visual input device comprises a camera capable of forming a two-dimensional electrical representation of a two-dimensional visual scene. A conventional television camera using a photocathode scanned by an electron beam may be used for this purpose. However, a camera comprising an array of individual detecting elements interrogated in a sequence by electrical means may also be employed. The visual input device may also comprise apparatus for converting the output of this camera into a form suitable for storage in a digital computer or equivalent which is adapted to receive the converted camera output and to provide outputs for controlling the displacement of the table.

Such an automatic machine tool has a greater knowledge of its environment than is possessed by a conventional machine tool. This has two main implications. Firstly it is possible to control situations that would otherwise be difficult to control. Secondly by using the visual information in a feedback loop operating on the separation of the mark and graticule image center it is no longer necessary to use the accurate mechanical position measuring devices required in numerically controlled machined which use "dead reckoning," without feedback from the position of the object on the machine table.

Returning to the example of an automatic printed-circuit-board or P.C. board drilling machine, a television camera is used to view the P.C. board and a small computer is used to process the TV image. The computer program determines the position of the drilling points on the board. Once a drilling point has been determined the computer directs an XY table to move the board to the required position where it is drilled.

The whole system is operating in a closed-loop situation which means that automatic compensations can be made for any defects in the camera or board motion. The graticule is mechanically fixed with respect to the drill position and an image of the graticule is projected into the optical system of the TV camera to appear coplanar with the P.C. board. The aim of the system is to position a drilling point on the board so that it appears to be coincident with the center of the graticule image. The camera can monitor its performance in this task and any necessary corrections can be applied.

It should be empahsized that the control principle outlined above is not confined to an automatic drilling machine but is generally applicable to control by visual feedback. A drilling machine of this type could have application in a research or development laboratory, in which short runs of boards of many different types are required. If the marks are invariant under rotation in certain applications the angular disposition may be variable, for example according to any of the four 90° orientations.

The control principle outlined above may for example be employed in machines that can correctly locate and orientate piece-parts so that they can be picked up and fed into an automatic assembly machine. For some objects this cannot easily be achieved by mechanical means. One possible solution is to look at the piece-part or object to determine its position and orientation. The tool holder is then replaced by a gripper mechanism which is rotatable under the control of the computer. The visual input device will then allow the relative orientations of piece-part and gripper to be determined and the gripper to be rotated and the piece-part to be displaced into registration with the gripper.

The visual input device may be adapted to identify a site previously machined by the tool, to measure any relative offset between the site position and the said graticule image center and to apply said offset to bring the mark into alignment with the tool in a subsequent machining operation. In the example of the drilling machine, the visual input device may be able to determine the position of the graticule center with respect to a datum on the photosensitive area of the camera. This datum may be a particular position on a particular line of the TV raster if the camera is a conventional TV camera as described above. The datum may be a particular detector element in the array if the stationary array type of camera is used. The geometry of the mark provided on the object to mark a drilling site is chosen to facilitate its detection and position measurement with respect to the camera datum. A hole when drilled also gives rise to a distinctive change of signal output. Thus the position of a drilled hole may be determined with respect to the camera datum. A comparison can then be made between the assumed position of the drill with respect to the graticule and to the camera datum. A corrective offset can then be derived if necessary and used when drilling a subsequent hole in another part of the board.

When making the first displacement of the board to bring a drilling site into coincidence with the graticule image center, this displacement may be a large part of the field of view of the camera. The number of subsequent corrective displacements is reduced if this first displacement is accurate in size and direction. Hence distances in the two co-ordinate directions as determined by the camera are preferably as closely equal to the table movements required as possible. The ratio between distances as measured by the camera and as table motions can also be measured and appropriate corrections determined where necessary. A particular mark, for example a drilled hole or a drilling site, can be identified on a board fixed to the table and its position determined with respect to the camera. Then a known displacement can be given to the table using the displacement measuring means and the new position of the same mark with respect to the camera measured. The displacement of the mark with respect to the camera can now be determined and compared with the known table displacement. The ratio of the displacements, will depend, among other things, upon the magnification ratio of the optical system used to image the board on the camera photosurface or the raster size on the TV camera. The ratio of displacements so determined may be stored in a store and used to provide corrected displacement commands for subsequent table motion based on camera measurements.

This invention furthermore relates to apparatus for detecting marks on a planar surface. The planar surface may be the original surface on which the mark occurs or may be the photosensitive surface of the electronic camera. The marks may be provided on the workpiece to assist in automatically handling or machining the workpiece, for example to align the marks under the operative center of a tool holder. Such a mark may be regarded as a restricted area or blob which is consistently darker or lighter than the surrounding region. The present invention is concerned with apparatus for detecting the presence of such a mark or blob. The invention provides an automatic machine tool, whereby the pattern recognition apparatus comprises means for applying an operator to said predetermined mark, said operator comprising an operative center element adapted to register with a given picture element and having a disposition of peripheral elements adapted to register with a further picture elements, and means for producing a recognition signal if at least a predetermined fraction of said peripheral elements meets the condition that it is in registration with a picture element having an intensity which differs from that of the picture element registration with the operative center by at least a predetermined threshold amount of the same sign.

The planar distribution of picture elements may be derived from an electron beam television camera as mentioned before. In this case the rows are derived from regularly spaced samples of video output along the lines of the television raster and the columns from corresponding samples in successive adjacent lines of the raster. The intensity of each picture element is then provided by the amplitude of the corresponding part of the video output. The video output corresponding to the intensity of each picture element sampled may, however, be digitized in that the maximum expected range of video outputs is divided into a number of regularly spaced intensity levels, for example 32. A given intensity is assigned the level value of that level to which it is closest. This level value may be coded as a binary code, for example as a five bit binary code in the case of 32 levels. Rows of operator elements may lie along the rows or along the columns or along diagonal lines intersecting the rows and columns or a combination thereof. An output signal is produced when the operative center is surrounded by a specific set of picture elements of which a predetermined subset are all either higher or all lower in intensity than the picture element at the operative center. The operator elements may lie on radial lines. Each radial line may contain only one operator element which is spaced at least one picture element away from the operative center. In this way, blobs of various shapes can be detected by the operator. In this respect the operator can be said to have an elastic quality since a variety of stretches and distortions of the blob can be handled. The radial lines may not have any operator elements for a predetermined number of element locations adjacent to the operative center and can be described as broken lines. In this case, if the contrasting area surrounding the blob is too small to reach the radial lines of the operator, the operator will not be satisfied and such a blob will be rejected. It may be desirable to reject such ring-like features. Alternatively, the operator condition with such broken lines may be such that more than one operator element in each line must differ in brightness from the operative center by at least a threshold amount.

An embodiment of the invention will now be described with reference to the accompanying diagrammatic figures:

FIG. 5 shows a typical digitized board picture as stored in the computer.

Figure 1:
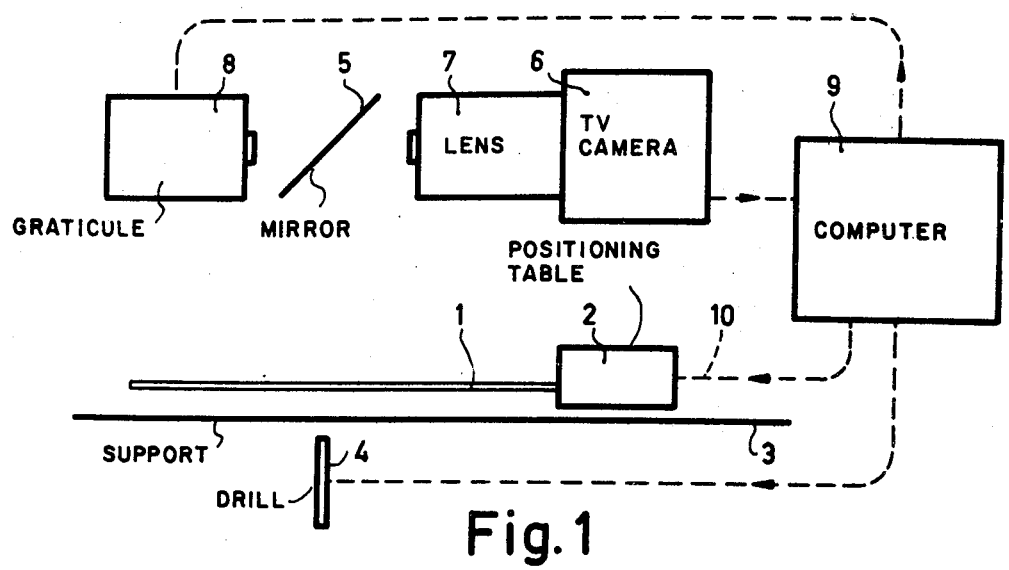
FIG. 1 shows a schematic drawing of the printed circuit board drilling machine.

Referring to FIG. 1, a printed circuit board 1, having its plane surface normal to the plane of the figure, is attached to a motor driven two-dimensional positioning table 2. Table 2 can make linear movements without rotation in two directions at right angles to one another in a plane parallel to the board 1 and the stationary support surface 3. The drill 4 (in a tool holder not shown) is below surface 3 and can be advanced through a hole in surface 3 to drill a hole in board 1 when the latter is stationary and clamped to surface 3. A plane semi-reflecting mirror 5 is arranged centrally above the drill 4 and provides a vertical view of the drilling area for a television camera 6 which has the optic axis of its lens 7 horizontal. A graticule 8 is arranged on the axis of lens 7 at a distance from mirror 5 equal to the distance from the board 1 to mirror 5. Thus, an image of graticule 8 is projected into the operative plane of the table and is in focus in the camera whenever board 1 is in focus. The camera 6 and a computer 9 comprise a visual input device. The computer 9 receives and processes the television camera image and issues movement commands 10 to the motor driven table 2. Stepping motors are used which respond to commands consisting of trains of pulses. The computer 9 also controls the graticule illumination and advances the drill 4 when required during a drilling sequence.

Figure 2:
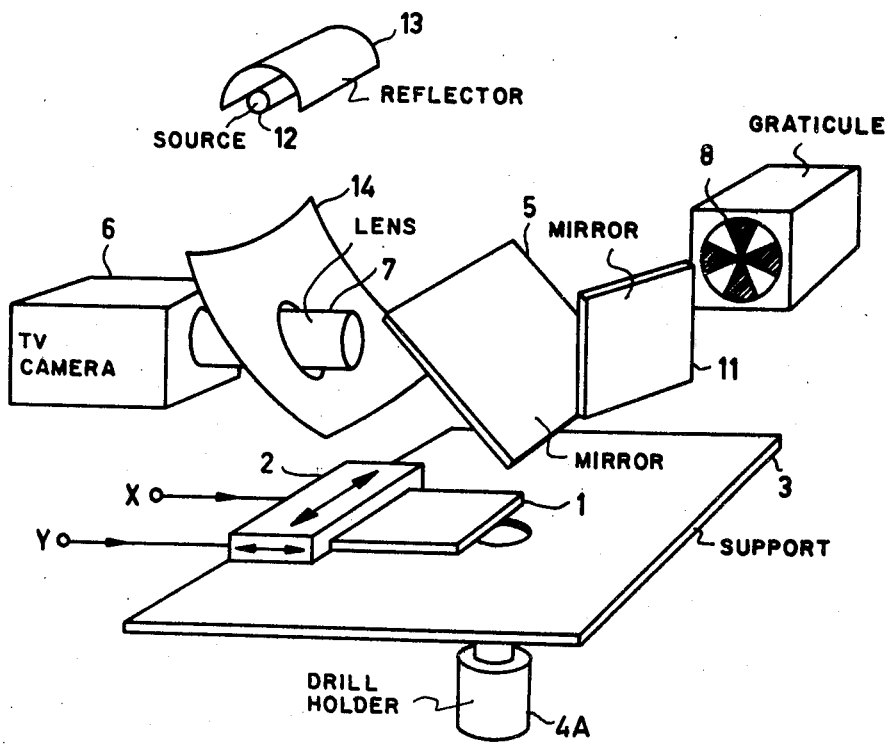
FIG. 2 shows a schematic drawing of a practical layout for the machine of FIG. 1.

Referring to FIG. 2 a more detailed schematic perspective view is shown of the mechanics of the drilling machine including the drill holder 4A. For more convenient access to the machine table, the graticule is viewed by the camera in a plane mirror 11 at 45° to the lens axis. Mirror 11 can also be adjusted, by means not shown, in angular setting about two axes at right angles to one another to allow the virtual image of the graticule 8 to be brought into coincidence with the virtual image of the drill seen in mirror 5. Specular illumination for the board 1 is provided by an illumination system which has an extended source 12 and a cylindrical reflector 13 to provided a first light source area. An inclined concave reflector 14 has an ellipsoidal configuration which produces a converging beam of light center along the axis of lens 7. After reflection at the plane semireflecting mirror 5, the beam passes downwards onto the board 1. Those parts of the beam which are specularly reflected by the board 1 are returned via the mirror 5 and converge into the aperture of lens 7. Thus mirror 14 images source 12 onto the aperture of lens 7.

The operation of the drilling machine system described with reference to FIGS. 1 and 2 will now be described.

The image from the televison camera is processed in the computer in two phases. First of all a search is conducted to find potential drilling points, hereinafter referred to as candidates. Most of the candidates found are in fact located on drilling points. In certain environments no further search is necessary. In other environments some candidates are false and are not drilling points. An operator for finding candidates will be described hereinafter, which looks for a dark area surrounded by a certain amount of lighter area. It is quite possible that a false candidate may be found which satisfies this operator. This is preferred when a careful search of the whole area for objects that are definitely drilling points would be extremely slow. It is better to have a very rapid search of the area for points which might be drilling points, that is, for candidates. Then those areas are searched in detail with an edge tracing operator to check whether they are in fact candidates.

When a candidate is found the coordinates thereof are stored in a store. Having obtained a list of candidates within a sub-area defined by the field of view of the television camera, each of the candidates is brought in turn to the center of the field of view where it is rescanned and then an edge tracing operator is used to trace around the edge of the dark area inside the copper pattern, to confirm whether the candidate is a true drilling point or a false drilling point. the test is that the edge tracing operator must return to its starting point within a fixed range of steps in the case of a "true" condidate. If, on the other hand, the design of the copper pattern is such that no dark area is present, it could be that the outside is traced. In case of only a single lead thereto, tracing the edge would within a fixed range of steps lead to a nearly return (i.e. to the other side of the said one lead). Having now confirmed a correct candidate, that is a true driling point, the center of the dark area at the drilling point is found. This center is aligned over the drill and the hole drilled. When all the candidates within a sub-area have been dealt with, the field of view of the camera is moved to another sub-area and the same process is applied to its contents. The edge tracing operators described in the French Patent Specification No. 2,150,150 are suitable for use in tracing the edge of the dark area when the stored image of this area has been converted to a binarized form.

When each candidate is moved to the center of the field of view it is centered on the image of the graticule, acting as a positional substitute for the drill, by retracing round the candidate to re-determine its center. If it is desired to recheck the position of the graticule the graticule illumination is now turned on at a sufficient brilliance to override the board image in the TV Camera. In a preferred example, automatic gain control circuits in the camera reduce the overall video gain so that the graticule image is within the dynamic range of the camera and the board image details are effectively lost. A separate program in the computer applies an operator to the graticule image to determine the position of the graticule center with respect to the camera raster. The re-determined drilling point center position and the graticule center position are then compared in the computer and a correction movement command sent to the board positioning motors if the difference in these two positions is greater than a predetermined allowable error. Once any correction has been made the hole is drilled or the coordinates of the drilling are punched onto a tape or both. Retaining the coordinates would be advantageous in case of a series of identical objects to be machined. An advantage of the use of stepper motors for the table drive is that the computer can keep a running total, with sign, of all displacement pulses issued as commands to the motors. This total may be set to zero at the start of board drilling when a positional datum on the board is centered on the graticule. Thus, the co-ordinates of all holes drilled or drilling sites found with respect to the board datum may be recorded. These co-ordinates are mechanical measurements and do not depend on the camera raster coordinates.

Before a board or set of boards is drilled on the machine, the parameters of what may be described as the computer's "world model" must be brought up to date. This world model consists, firstly, of a set of basic assumptions about the environment of the drilling task. These assumptions are inherent in the machine construction, such as the orthogonality of the table motions or the parallelism of the camera raster lines to one of the table motions. Other assumptions concern the shape of drilling points and the graticule geometry. These assumptions are inherent in the choice of operator used to detect them. Other assumptions concern the options in machine behavior which are allowed in response to the facts of the environment as determined by the TV camera. Finally, an assumption is built into the choice of method for processing the camera video output into binary signals.

Secondly, the world model consists of the set of parameters referred to in the assumptions which only have a limited useful life. There are (a) the position of the board with respect to the origin of the co-ordinates on the table, (b) the ratio between a given table displacement and the value of this displacement as measured by the camera and may be called the camera-to-table scale, (c) the position of the graticule center as seen by the camera, (d) the position of the drill with respect to the graticule center, and (e) a histogram of the grey levels currently being encountered by the camera and used to determine the binary threshold.

Before drilling commences on a board, an initialization procedure is carried out by the computer to measure up-to-date values of the first four of these five parameters. Thus the origin (a), scale factor (b), graticule position (c) and graticule offset (d) will be determined for each board as it is clamped to the table. Parameters (a), (b) and (c) will be dependent on camera raster drift. The drill to graticule offset (d) will be constant for much longer periods of time because it is affected by the nominally rigid machine structure only. The grey-level histogram (e) will need to be updated constantly during the drilling of one board since the reflectivity of the board may vary from place to place and the illumination provided by the source may vary with time.

Figure 3:
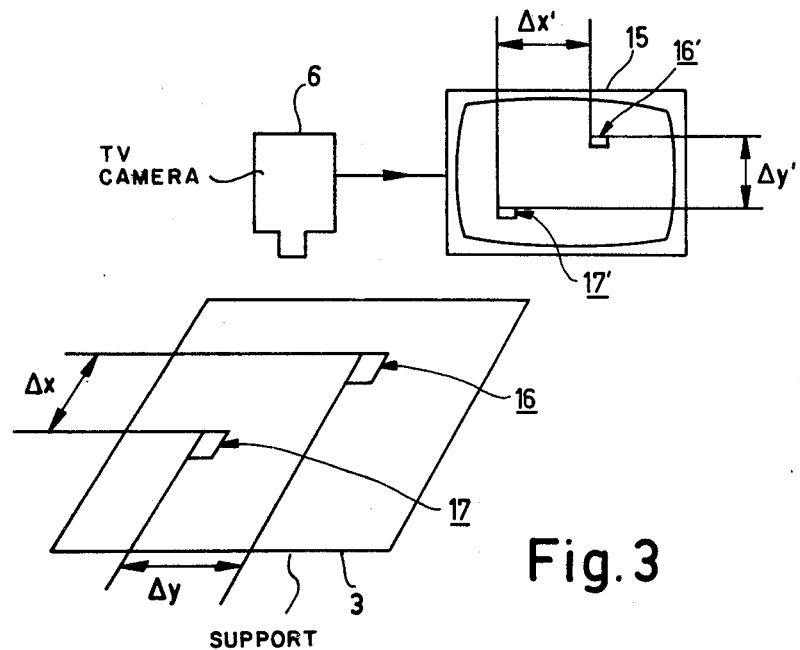
FIG. 3 shows the determination of the motion scale factor.

The determination of the motion scale factor (b) is shown in FIG. 3. The fixed table 3 is shown schematically as a rectangular plane viewed normally by the camera 6. The camera display 15 is shown schematically. An isolated feature is shown at an initial position 16 on the table 3 and at a final position 17 after known displacements in x and y have been applied to it. This feature, which may be a drilling position for example, or may be a special symbol etched on the board, is recognizable by the computer after the camera image has been processed. The initial (16') and final positions (17') of the feature image are shown on the display 15. The ratio of the true displacement of the feature in $x$, $\Delta x$, to the displacement of the feature as measured by $\Delta x'$ is then calculated in the computer and stored as a correction factor to be applied to any subsequent camera measurement of displacements. Likewise, the correction factor in $y$, the ratio of $\Delta y$ to $\Delta y'$, is calculated and stored.

Figure 4:
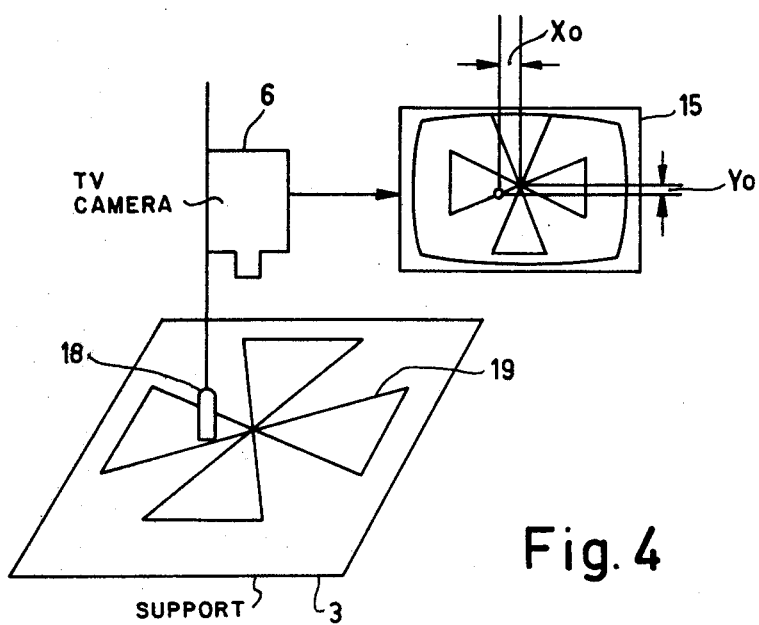
FIG. 4 shows the determination of the drill to graticule offset.

FIG. 4 shows schematically the measurement of the offset between graticule and drill. For clarity, the image 19 of the graticule, when referred to the table 3, is shown on the table. The drill 18 is shown schematically as having drilled a hole. With the graticule illuminated, the graticule detection operator in the computer enables the position of the graticule center on the display 15 to be determined. With the graticule illumination off and the drill holl illuminated, the edge tracing operator in the computer enables the effective position of the drill on the display 15 to be determined. The offsets $Xo$ and $Yo$ of the drill center from the graticule center can then be calculated and stored as correction offsets to be applied to drilling site co-ordinates which have been determined with respect to the graticule by the camera.

The picture element rate of a standard 625 line television picture is too high, being roughly 10 million per second, to be conveniently loaded into a computer store. To reduce the rate of loading, the interface circuits between the camera and the computer store sample only one picture element in every line of the picture. Although the video amplitude for one picture element is only present for 0.1 $\mu$S or so, this amplitude can be sampled and held, by a suitable circuit, for the full 64 $\mu$S of the line period. This 64 $\mu$S gives time for an analog-to-digital converter to digitize the sampled video signal into 5 binary digits, that is to say, into 32 grey levels. There is then still time left for these 5 digits to be loaded into a selected store location. On the following line, the single element vertically under the previous picture element sampled, that is to say, the picture element at the same address along the following line, is sampled, digitized and loaded into another store location. Thus, during one frame time of the camera, 40 m sec, a single vertical column of picture elements is stored. In the next frame, the address along the lines is altered by one picture element width and the next adjacent vertical column of picture elements is sampled, digitized and stored. Continuing in this manner in successive frames, any predetermined area within the field of view of the camera can be digitized and loaded into the store. If desired, a lower resolution picture may be stored by changing the line address for sampling at the start of each frame by more than one picture element displacement. The stored columns of picture elements are then a predetermined number of picture elements apart. Also, instead of sampling every line of the camera picture, a predetermined number of lines may be omitted between sampled lines. The stored rows of picture elements are then also another predetermined number of picture elements apart.

FIG. 5 shows diagrammatically a typical scene that might be input to the computer from a printed circuit board. The grey levels shown here are on the scale from 0 to 31. To locate the drilling points, the candidates must first be located. The candidates have points which are dark, in other words have high grey level values surrounded by a number of points that have low grey level values.

In FIG. 5, picture element 50 having a grey value of 26 is a candidate. Picture element 51 having a grey value of 18 is near the center of an area which may be a candidate. There may be more than one candidate per drilling point. Having found a candidate, a higher resolution image centered on the candidate is obtained. This image is binarized and an edge tracing operator is applied to the candidate to find whether a closed loop of edge points exists around the candidate. The edge tracing operator used in this case is suitable for application only to a binarized image. Thus in the digitized picture of FIG. 5 a threshold grey level must be applied to every picture element to decide whether it shall be represented in the binarized picture by a '1', that is shown as a black point or by a '0', that is shown as a white point. The threshold level appropriate for one area of the picture may not be appropriate for another area of the picture as the grey levels of all picture elements in one area may be different from those in another area. Also, a drilling point may be an area of low grey level values surrounded by an area of high grey level values. For each picture a histogram of local greyness values is kept to provide a threshold level which will separate drilling point areas most clearly from copper areas.

Figures 6A, 6B:
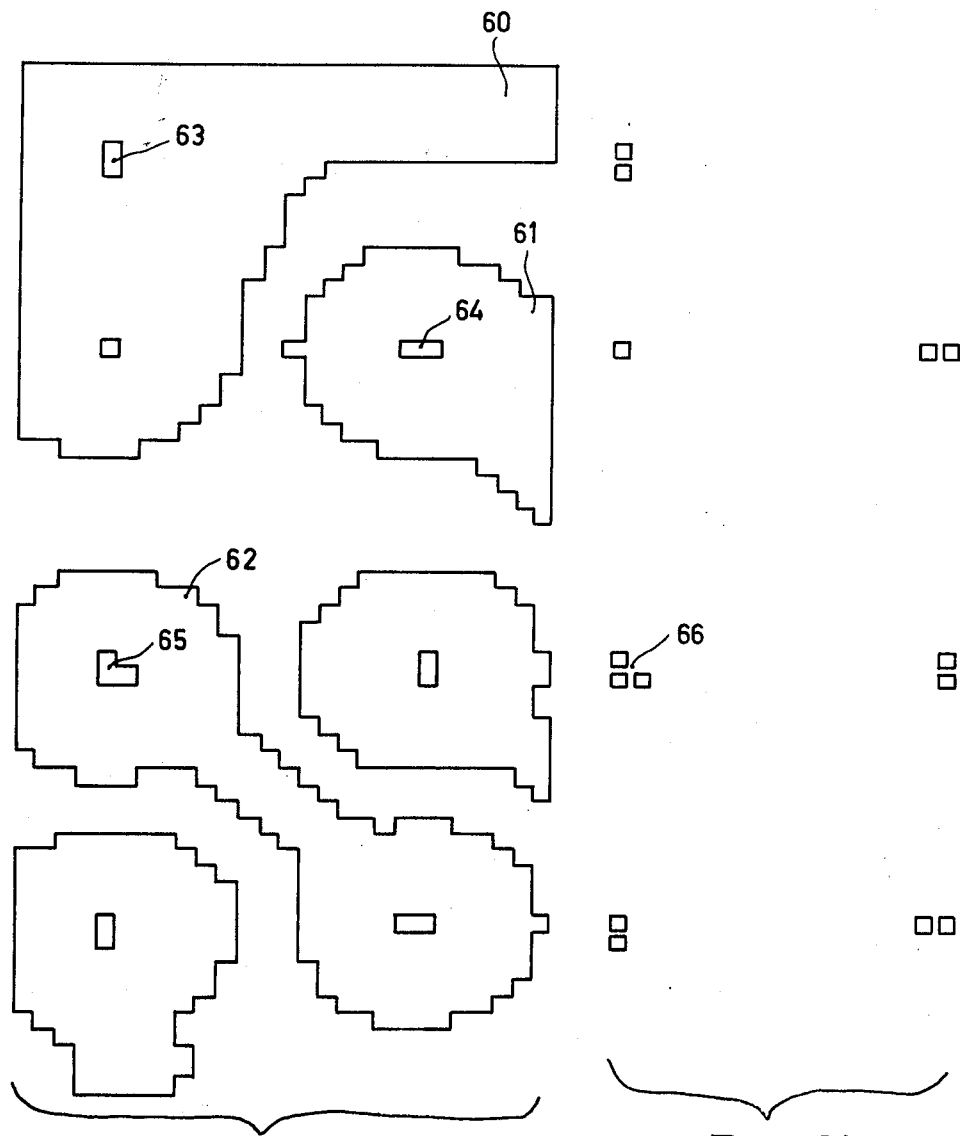
FIG. 6 shows a typical binarized board picture and the resulting candidate drilling points.

Such a binarized picture is shown in FIG. 6, wherein at (a) for convenience in drawing those areas 60, 61, 62, which consist entirely of copper are shown as areas enclosed by a stepped line. The minimum step size shown indicated one picture element. Areas 63, 64, 65 are areas of white points within the black areas and such white areas contain candidates. At (b) in FIG. 6, the candidates which satisfy the closed loop test of the edge tracing operator are shown extracted from the binarized picture. Rules may now be adopted to select only one candidate from a group of adjacent candidates, for example the three adjacent candidates 66. These rules prevent any attempt by the machine to drill two or more closely overlapping holes; such attempts would be likely to break the drill.

Figure 7:
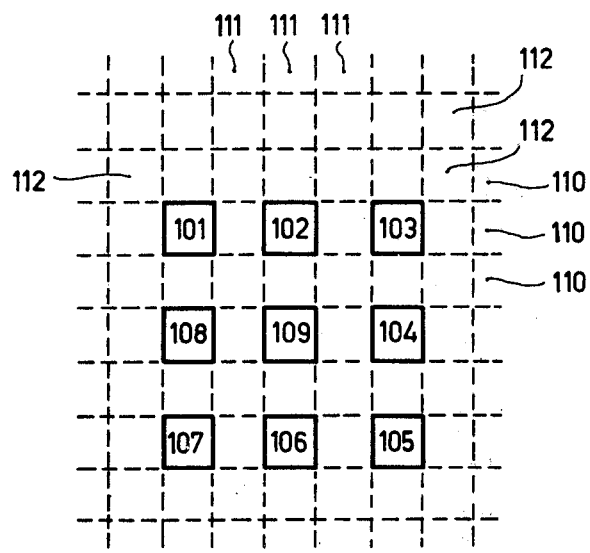
FIG. 7 shows an operator having one operator element only on each of eight radial lines.

Referring to FIG. 7, the rows 110 and columns 111 of picture elements 112 are shown at right angles to one another and as defining square picture elements. The intensity value of a picture element will be the average intensity across the area of square defining that picture element. The operative center 109 has eight lines of operator elements radiating from it. Each line has only one operator element. For example, element 102 is the only element in the vertical ascending line and element 103 the only element in a diagonal line. In this operator, the elements in a line are not adjacent but are spaced one picture element apart. Thus the whole operator is contained within a square having a side of five picture elements.

Figure 8:
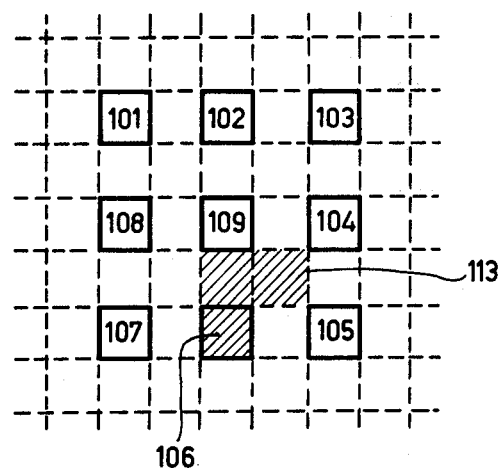
FIG. 8 shows a dark area not detected by the operator of FIG. 7.
Figure 9:
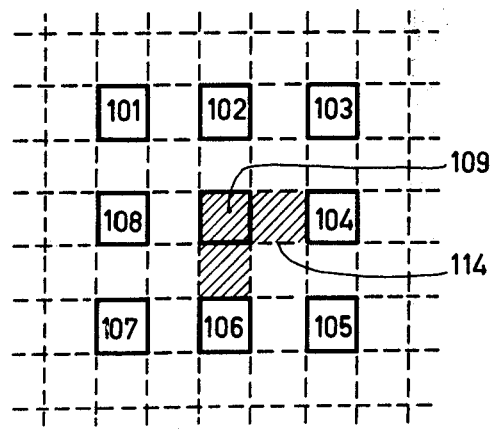
FIG. 9 shows a dark area which is detected by the operator of FIG. 7.

Referring to FIG. 8, an L-shaped dark area 113 occupying three picture elements is shown falling within the ambit of the operator of FIG. 7, operator element 106 being in registration with a dark picture element. Operative center 109 is brighter than element 106 by the threshold amount but is equal in brightness with operator elements 101 . . ., 105, 107 and 108. Thus the operator condition is not satisfied and no recognition signal is obtained from the operator. In FIG. 9, an L-shaped dark area 114 is shown falling more centrally in the operator ambit. The operative center 9 is now the only element of the operator in registration with a dark picture element and is darker than all the line elements 101 to 108 inclusive by the threshold amount. The operator condition is satisfied and a signal signifying that a mark has been detected is obtained from the operator.

The operator shown in FIG. 7 (defined on a square grid) is correlated with the picture to be analyzed which is sampled on the same square grid. The operator is such that only the center point and eight points distributed on the edge of a square of size D (odd number) are considered. Let P ($i$) be the density of one picture element $i$ seen through the template. Let T be a threshold quantity.

If the condition:

$$P(9) > P(i) + T \text{ for } i = (1,8) \tag{1}$$

is satisfied, then a blob is present in the region bounded by the outside elements 1 to 8 and one of its elements is element 9 (see FIG. 3).

The actual size of the blob is not measured but this is not the purpose of the operator. A maximum in a two dimensional function can be recognized by this operator. A situation where a dark line or an edge crosses the domain of the operator is not enough to satisfy the condition (1). However, if another object is close enough to be seen by one or more of the edge elements of the operator, condition (1) is not satisfied although an object appearing as a blob is present (see FIG. 10).

Figure 10:
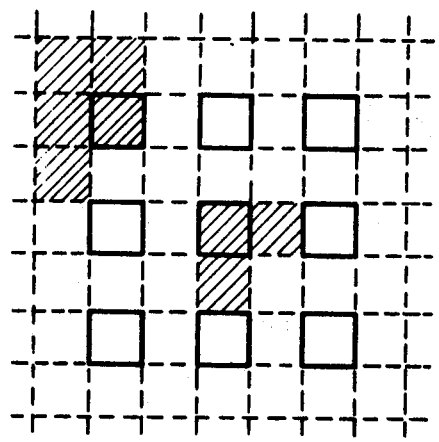
FIG. 10 shows a dark area too close to another dark area to be detected by the operator of FIG. 7.
Figure 11:
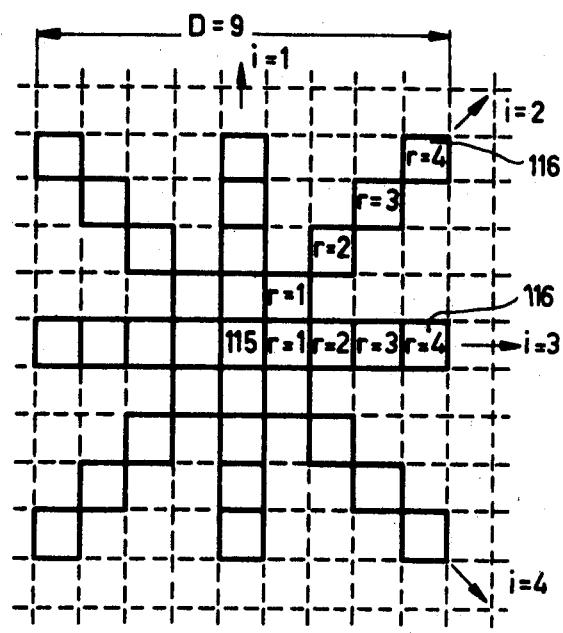
FIG. 11 shows a general form of an extension of the operator.

A general form of an extension of the operator which will cope with the situation of FIG. 10 is shown in FIG. 11. With this operator the blob is considered as a dark object surrounded by a closed ring of picture elements which are lighter than the object itself. The shape of this ring is not defined but its internal dimension must be smaller than the dimension D. D is the size of the operator designed to recognize this situation. D is an odd number and in FIG. 5, D = 9. This operator is a square template composed of eight linear arrangements 116 radiating from the center 115.

To express the operator condition more concisely, let P ($i,r$) be the density of one picture element seen through the element $r$ of branch $i$ of the operator, and let P(0) be the density seen through the center of the operator. Now condition (1) becomes:

$$P(0) > P\text{min}(i) + T \text{ for } i = (1,8) \tag{2}$$

in which Pmin($i$) is the minimum value of P at any $r$ from 1 to $\frac{1}{2}$(D−1) to (D−1)/2 for each line $i$.

Figure 12:
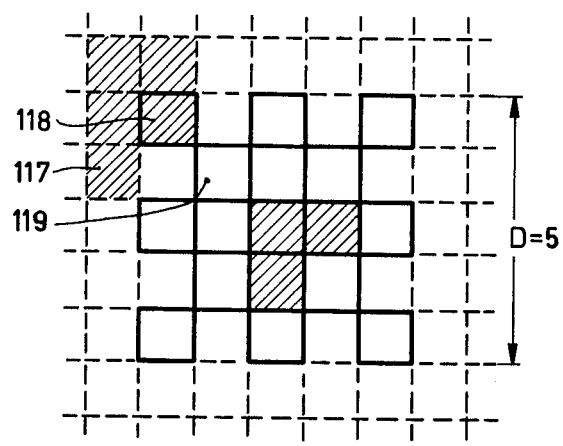
FIG. 12 shows the problem of FIG. 4 resolved by an extension of the operator.

In other words, at least one element along each branch must satisfy condition (1). This operator can detect one object close to another one. An operator of this kind with D = 5 is shown in FIG. 12. The adjacent dark area 117 covers one operator element 118. But element 119 in the same line as element 118 is not covered and hence the operator condition is satisfied.

Figure 13:
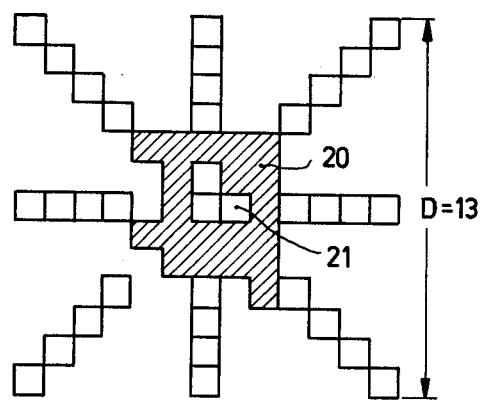
FIG. 13 shows a version of the operator which will reject a blob surrounded by too little contrasting area.

FIG. 13 shows a form of the operator in which two of the innermost operator elements of each radial line are absent. The dark area 20 surrounding the blob or mark 21 fails to extend as far as any of the innermost ends of the radial lines. In this case the condition of the operator is not met by any of the radial lines and the blob is rejected as being surrounded by too little contrasting area.

Figure 14:
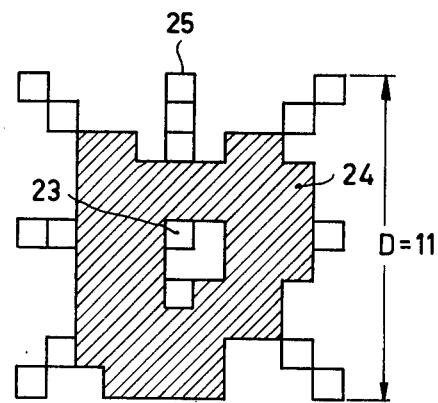
FIG. 14 shows another version of the operator which will reject a blob having a surround which is too thin at at least one point.

FIG. 14 shows a form of the operator in which only one innermost operator element is missing from each radial line and in which the operator condition requires that at least two operator elements in each radial line shall differ in intensity from the operative centre 23 by at least a threshold amount. An example of a dark area 24 is shown which fails to cover two operator elements on radial line 25. This blob is rejected as being surrounded by a dark area which is too thin at one point.

Figure 15:
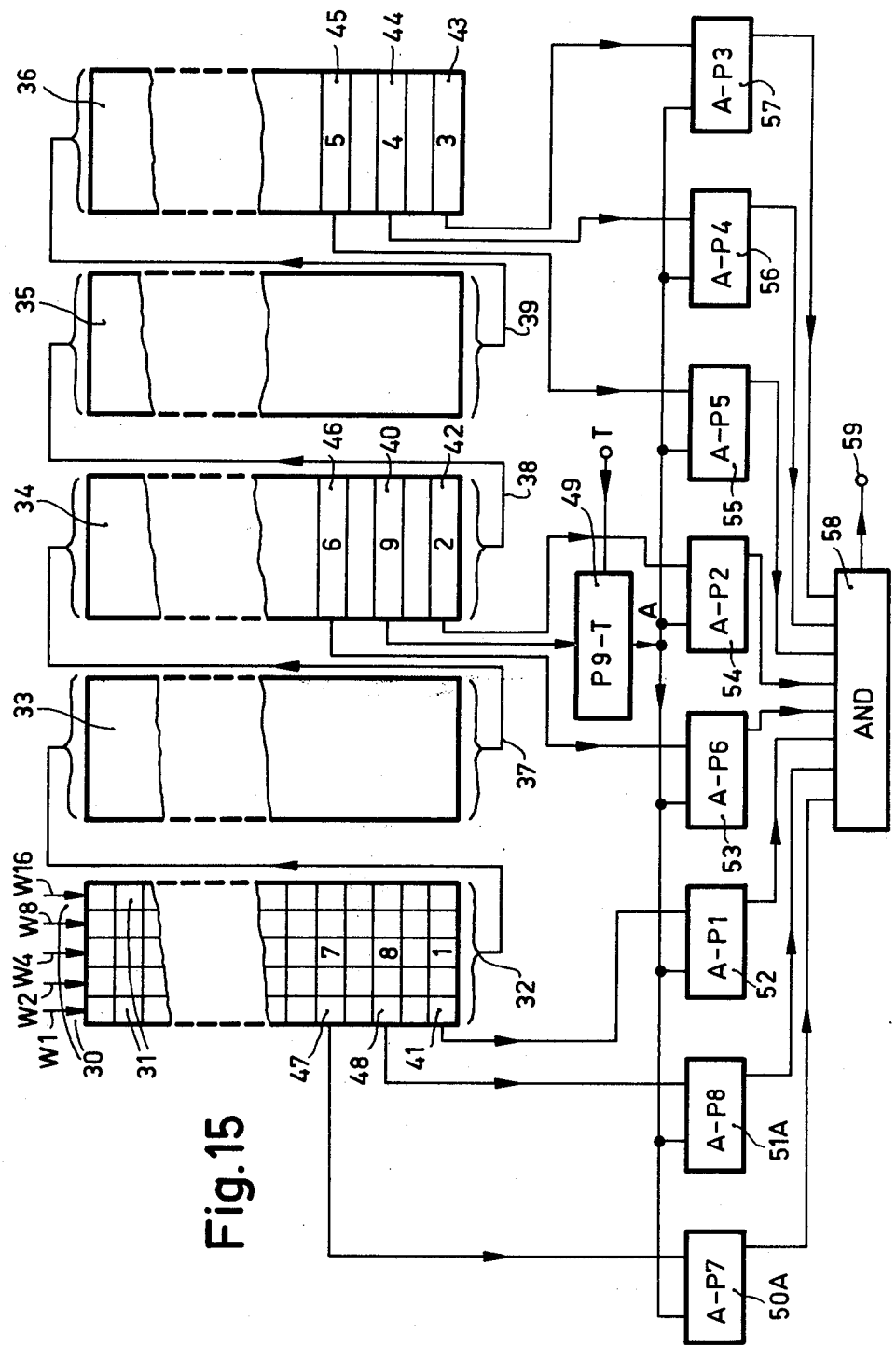
FIG. 15 shows apparatus for applying the operator to a digitized picture.

FIG. 15 shows apparatus for applying the operator of FIG. 7 to a digitized picture. It is assumed in the following description of FIG. 15 that the picture was scanned in 64 vertical columns each of 64 picture elements and that each picture element was digitized into a 5 bit binary code defining 32 grey levels. Thus the picture information becomes available to the apparatus of FIG. 15 as a succession of 5 bit codes each describing a picture element starting at the top left hand of the scanned area and scanning downward in adjacent columns in turn to the right. The 5-bit codes are assumed to be available in parallel along 5 conductors. When the 5-bit code for the first picture element at the top of the left hand column of the scanned area becomes available, the five digits of the code are fed in parallel into the inputs 30 of five 64 bit shift registers 31. These five inputs 30 are shown with their binary weightings W1, W2, W4, W8 and W16 respectively. A shift pulse is then applied to all stages of the registers 31 by means not shown. The first 5 bit code is thereby shifted down the registers 31 by one stage and the inputs of the shift registers 31 are then free to receive the next 5-bit code from the second picture element down the left hand column of the scanned area when it becomes available. This process continues until all 64 picture elements of the left hand column of the scanned area have been input in sequence to the registers 31 and these registers are then completely full. Five outputs 32, shown for convenience as a single conductor, are taken from the bottom of registers 31 and connected to corresponding inputs at the top of a second set 33 of five 64 bit shift registers. All stages of registers 33 are fed with shift pulses from the same source as registers 31 and so also are all stages of the farther three sets of five 64 bit shift registers 34, 35 and 36. Thus as 5-bit codes arrive from the second column from the left of the scanned area, these are fed into the top of registers 31 and the digits of the first column are transferred in sequence to registers 33. This occurs because the number of stages in each register has been made equal to the number of picture elements in a column. Thus when the second column has been scanned the digitized picture information of these first two columns is to be found, in order, in registers 31 and 33 respectively. Digits representing picture elements along a row in the scanned area are located at the same addresses down the registers and therefore, as drawn in FIG. 15, appear horizontally adjacent in registers 31 and 33. The individual stages are not shown in registers 33 and 35, and only in skeleton form in registers 34 and 36 at those points from which outputs will be taken.

Column after column from the left of the scanned area is input in this manner to the array of five sets of registers 31, 33, 34, 35 and 36, the respective connections 32, 37, 37 and 39 from the bottom of one set of registers to the top of the next set of registers to the right ensuring that all the picture information passes through each set of shift registers. When five complete columns have been scanned, the bottom five stages of the five sets of registers contain, at that time, the picture information of a square array of picture elements having a side of five elements at the top left hand corner of the picture. Referring to FIG. 7, the operator shown there is contained within a square of side five elements. Thus, at the instant referred to above, the grey values of a set of picture elements fitting the operator of FIG. 7 can be obtained from the relevant stages of the shift register in parallel and the operator condition applied to them. The operative center 109 is connected to the third stage from the bottom of registers 34. The operator elements 101 to 108 inclusive are connected to stages 41 to 48 inclusive respectively. The threshold value T is applied as a binary number to a digital subtractor 49 to which the binary number of stage 40 is also applied. The quantity A is output by subtractor 49 as the value of the greyness of element 9 less the threshold value T. Eight digital subtractors 50A, 51A, 52 . . ., 57 inclusive are all supplied with the value A and each is supplied with the grey value of the relevant operator element. Element 101, for example, is supplied by the bottom stages 41 of registers 31 and subtractor 52 supplies a '1' output if the result of subtracting element 1 greyness value from A is zero or a positive number. The registers 33 and 35 are present to provide the storage necessary since the operator of FIG. 7 is applied to alternate columns of picture elements. The eight input AND gate 58 thus receives eight binary inputs, all of which will have the value '1' if the operator condition is satisfied, and provides a '1' output at terminal 59 in this event.

As the sixth column from the left is scanned and registers 31 being to receive the digitized greyness values of the picture elements in that column, the contents of all the registers 31, 33, 34, 35 and 36 move downward. This has the effect of moving the operator down the left hand side of the picture. At each shift pulse, the operator condition is re-applied and the output at terminal 59 indicates whether a blob is present at the immediate location of the operative center. The effect of scanning further columns in the picture is to continue applying the operator to successive columns in the picture. Information is discarded from stage 43 at the bottom of registers 36. There is a period near the end of each column scan when the operator is receiving information partly from picture elements at the bottom of one column and partly from picture elements at the top of the next column. The output of AND gate 58 is discarded, by means not shown but controlled from the scanning cycle, during this transition period.

In the foregoing the operators described had strings of operator elements lying on straight lines extending radially from the operative center. On the other hand, these lines may also have a tangential direction superposed on said radial direction. It is not even necessary that these lines are straight lines. In other cases multiple lines may be applied, or other combinations of light and dark operator elements may be found useful.

What is claimed is:

1. An automatic machine tool system comprising a stationary bed;
   a two-dimensional positioning table supported on said bed having an operative plane;
   means for measuring the displacement of said table in each said dimension relative to said bed;
   a tool holder fixed relative to said bed and having an operative center;
   visual input means fixed relative to said bed having a field of view including a portion of said table containing said operative center, comprising:
   (a) means for identifying a predetermined mark inherently present on a surface of an object fixed in a predetermined position on said table, the surface lying in said operative plane, and detecting in said operative plane a plurality of picture elements, each of said picture elements having a predetermined one of a plurality of intensity levels;
   (b) means for applying an operator to said predetermined mark, said operator comprising an operative center element adapted to register with one of said picture elements, and a plurality of peripheral elements situated on rows extending radially outward from the region of said operative center element for registering with picture elements extending radially outward from said one picture element;
   (c) means for producing a recognition signal if at least one of said peripheral elements in each of said rows satisfies the condition that said at least one peripheral element is in registration with a picture element having an intensity level which differs from that of said one picture element in registration with said operative center element by at least a predetermined threshold amount;
   means for introducing a graticule having a center into the field of view of said visual input means so that said center of said graticule is substantially aligned with said operative center;
   means for identifying the location of said graticule;
   means for measuring the separation of said mark from said center of said graticule; and
   driving means for producing a relative displacement between said table and said tool holder corresponding to said measured separation for aligning said mark with said center of said graticule.

2. A system as claimed in claim 1, wherein said operator includes a gap of a distance at least equal to that of the width of one peripheral element between said operative center element and the first one of said peripheral elements in each of said rows of said peripheral elements.

3. A system as claimed in claim 1, wherein each of said rows of peripheral elements contains a single one of said peripheral elements.

4. A system as claimed in claim 2, wherein said means for producing a recognition signal produces a recognition signal if more than one peripheral element in each of said rows extending radially outward from the region of said operative center element satisfies said condition.

5. A system as claimed in claim 1, wherein the maximum expected range of said picture element intensity levels is divided into a plurality of equally spaced levels and wherein intensity level of each of said picture elements is assigned one of said levels to which its actual value is closest.

6. The system as claimed in claim 1, wherein said visual input means further comprises means for identifying a site previously machined for measuring any relative offset between the position of said site and said center of said graticule, and for applying said offset to bring said mark into alignment with said center of said graticule in a subsequent machining operation.

7. The system as claimed in claim 1, wherein said visual input means further comprises means for measuring the ratio between a given table displacement and the value of said displacement as measured by said visual input means, means for storing said ratio, and means for applying said ratio as a correction factor to subsequent table displacements as measured by said visual input means.

8. The system as claimed in claim 1, wherein said visual input means further comprises means for applying an image of said object fixed on said table during alignment of said mark with said center of said graticule which is of higher resolution than that used for identifying said mark.

9. The system as claimed in claim 1, wherein said visual input means further comprises a camera for forming a two-dimensional grey-level electrical representation of a portion of said operative plane on an output thereof, said representation comprising regularly spaced rows and columns of picture elements; means for applying a threshold level to said grey-level representation output of each of said picture elements for producing a binarized representation of the table area viewed; and means for compiling a histogram of said grey levels of said picture elements of said portion of said operative plane, said histogram providing an optimum value for said threshold level.

10. The system as claimed in claim 9, wherein said camera is a television camera having a raster, and said rows and columns of picture elements are derived from said raster of said television camera.

11. The system as claimed in claim 1, wherein each of said rows comprises the same number of said peripheral elements.

* * * * *